(12) United States Patent
Lim

(10) Patent No.: US 11,050,956 B2
(45) Date of Patent: Jun. 29, 2021

(54) IMAGE SENSOR AND METHOD FOR INCREASING SIGNAL-NOISE-RATIO THEREOF

(71) Applicant: PIXART IMAGING INC., Hsin-Chu (TW)

(72) Inventor: Wooi-Kip Lim, Penang (MY)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 16/368,967

(22) Filed: Mar. 29, 2019

(65) Prior Publication Data

US 2020/0314366 A1 Oct. 1, 2020

(51) Int. Cl.
*H04N 5/357* (2011.01)
*H04N 5/355* (2011.01)
*H01L 27/146* (2006.01)
*H04N 5/369* (2011.01)
*H04N 5/351* (2011.01)

(52) U.S. Cl.
CPC ....... *H04N 5/357* (2013.01); *H01L 27/14609* (2013.01); *H04N 5/3559* (2013.01)

(58) Field of Classification Search
CPC ...... H04N 5/3559; H04N 5/235; H04N 5/243; H04N 5/335; H04N 5/351; H04N 5/369; H04N 5/374; H04N 5/3745; H04N 5/378; H04N 5/357; H01L 27/14609
See application file for complete search history.

(56) References Cited

U.S. PATENT DOCUMENTS

| | | | | |
|---|---|---|---|---|
| 8,773,562 B1* | 7/2014 | Fan | ............... | H01L 27/14634 348/308 |
| 10,582,138 B2* | 3/2020 | Gilhotra | ............... | H04N 5/3745 |
| 2006/0255240 A1* | 11/2006 | Etoh | ............... | H01L 27/14623 250/208.1 |
| 2006/0261431 A1* | 11/2006 | Kim | ............... | H01L 27/14609 257/462 |
| 2009/0045319 A1* | 2/2009 | Sugawa | ............... | H01L 27/14609 250/208.1 |
| 2012/0188427 A1* | 7/2012 | Solhusvik | ............... | H04N 5/3559 348/300 |
| 2012/0256077 A1* | 10/2012 | Yen | ............... | H04N 5/37452 250/208.1 |
| 2012/0273651 A1* | 11/2012 | Willassen | ............... | H01L 27/14641 250/208.1 |
| 2014/0117206 A1* | 5/2014 | Park | ............... | H01L 27/14609 250/208.1 |
| 2016/0005788 A1* | 1/2016 | Ogura | ............... | H01L 27/14603 257/229 |

(Continued)

*Primary Examiner* — Albert H Cutler
(74) *Attorney, Agent, or Firm* — Li & Cai Intellectual Property (USA) Office

(57) ABSTRACT

An image sensor includes a transistor, at least one storage capacitor and a voltage provider. The at least one storage capacitor is connected to the transistor. The voltage provider is electrically connected to the transistor and configured to provide an extra voltage for the at least one storage capacitor. The extra voltage is variable in response to images with different brightness. The image sensor includes the voltage provider to provide extra voltage to increase the charging capacity of the storage capacitor. The Signal-Noise-Ratio of the image sensor won't be affected and the fill factor is able to be maintained at a certain level.

12 Claims, 4 Drawing Sheets

(56) References Cited

U.S. PATENT DOCUMENTS

| | | | | |
|---|---|---|---|---|
| 2016/0173804 A1* | 6/2016 | Borremans | .......... | H04N 5/3745 |
| | | | | 348/301 |
| 2016/0316163 A1* | 10/2016 | Beck | .................... | H04N 5/3559 |
| 2016/0337567 A1* | 11/2016 | Okura | .................. | H01L 29/945 |
| 2017/0150017 A1* | 5/2017 | Geurts | ................. | H04N 5/2355 |
| 2019/0238767 A1* | 8/2019 | Satou | ................ | H01L 27/14634 |

* cited by examiner

IMAGE SENSOR AND METHOD FOR INCREASING SIGNAL-NOISE-RATIO THEREOF

FIELD OF THE DISCLOSURE

The present disclosure relates to an image sensor and method for increasing signal-noise-ratio thereof, and more particularly to an image sensor and method for increasing signal-noise-ratio thereof when chips manufactured by the semiconductor process of the image sensor is less than 30 μm.

BACKGROUND OF THE DISCLOSURE

FIG. 1 is a schematic view of a conventional image sensor. As shown in FIG. 1, the image sensor 10 includes a BJT transistor 11, a plurality of switches 12, a first storage capacitor 13 and a second storage capacitor 14.

The BJT transistor 11 is electrically connected to the switches 12, the first storage capacitor 13 and the second storage capacitor 14. The BJT transistor 11 is configured to control the switches 12 to turn on or off so as to allow the first storage capacitor and the second storage capacitor operate in two phases (a reset phase and a discharging phase). In the reset phase, the first storage capacitor 13 and the second storage capacitor 14 begin charging. In the discharging phase, the first capacitor 13 and the second capacitor 14 begin discharging.

A fill factor is a ratio between an area of a light sensing portion and an overall area of the image sensor 10. When the fill factor is higher, the performance of the image sensor 10 is better.

FIG. 2 is a schematic view of the image sensor in a 30 micrometer semiconductor process. As shown in FIG. 2, an image sensor 20 in a semiconductor includes a light sensing portion 21, a pixel circuit portion 22 and a capacitor portion 23. The fill factor in the image sensor 20 is about 72% at the 30 μm semiconductor process. When the semiconductor process is improved to lower the size of the image sensor 20, the smaller size of the storage capacitors 23 would help to increase the fill factor of the image sensor 20 for better light responsivity, but the signal-to-noise ratio (SNR) will drop.

Therefore, as the size of the capacitor portion 23 becomes smaller and smaller, a need has arisen to maintain or increase the SNR of the image sensor 20 and the fill factor at the same time.

SUMMARY OF THE DISCLOSURE

In response to the above-referenced technical inadequacies, the present disclosure provides an image sensor including a transistor, at least one storage capacitor and a voltage provider. The at least one storage capacitor is connected to the transistor. The voltage provider is electrically connected to the transistor and configured to provide an extra voltage for the at least one storage capacitor. The extra voltage is variable in response to images with different brightness.

In certain embodiments, the image sensor is made of Bipolar Junction Transistor (BJT) or Metal-Oxide-Semiconductor Field-Effect transistor (MOSFET).

In certain embodiments, the image sensor further includes a plurality of first switches, and the first switches are turned on or off by the transistor so as to charge or discharge the at least one storage capacitor.

In certain embodiments, the voltage provider provides the extra voltage for the at least one storage capacitor to increase a collective charge of the at least one storage capacitor so as to increase a signal-noise-ratio (SNR).

In certain embodiments, the chips manufactured by the semiconductor process for the image sensor are less than 30 μm.

In certain embodiments, a size of the at least one storage capacitor is less than 92 μm$^2$, and a capacitance of the at least one storage capacitor is less than 120 pF.

In certain embodiments, the image sensor further includes a second switch connected to the voltage provider in parallel.

In certain embodiments, the image sensor is operated in a normal mode when the second switch is open, and the image sensor is operated in a voltage boost mode when the switch is closed.

In one aspect, the present disclosure provides a method for increasing a signal noise ratio of an image sensor, the image sensor including a transistor, a plurality of first switches, at least one storage capacitor, a voltage provider, and a second switch, the transistor being electrically connected to the first switches, the at least one storage capacitor and the voltage provider, the voltage provider being connected to the second switch in parallel, and the method including: installing a voltage provider in the image sensor; and providing an extra voltage to a plurality of storage capacitors by the voltage provider when a capacitance of the storage capacitors is less than 120 pF. The extra voltage is variable in response to images with different brightness.

In certain embodiments, the method further includes a step of cutting off the second switch when the image sensor is operated in a normal mode or closing the second switch when the image sensor is operated in a boost mode. In certain embodiments, the step of providing the extra voltage to the at least one storage capacitor by the voltage provider is to increase the SNR of the image sensor.

In certain embodiments, the step of providing the extra voltage to the at least one storage capacitor by the voltage provider is to maintain a fill factor of the image sensor.

In certain embodiment, the image sensor is made of Bipolar Junction Transistor (BJT) or Metal-Oxide-Semiconductor Field-Effect transistor (MOSFET).

As the size of the at least one storage capacitor decreases, the voltage inputted in the image sensor would need to be increased so as to increase the charging capacity of the at least one storage capacitor. The image sensor in the present disclosure includes a voltage provider to provide extra voltage to increase the charging capacity of the storage capacitor. Therefore, the SNR of the image sensor will not be affected and the fill factor is able to be maintained at a certain level.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
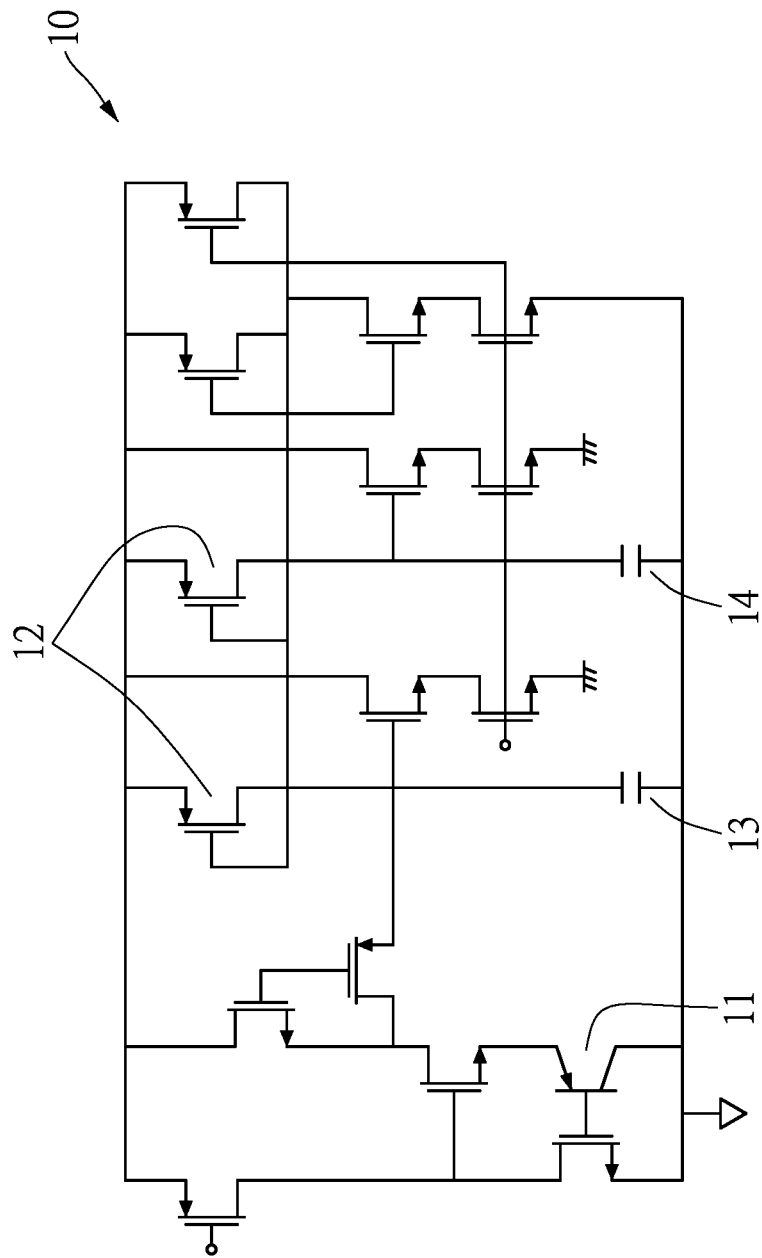
FIG. 1 is a schematic view of a conventional image sensor.
Figure 2:
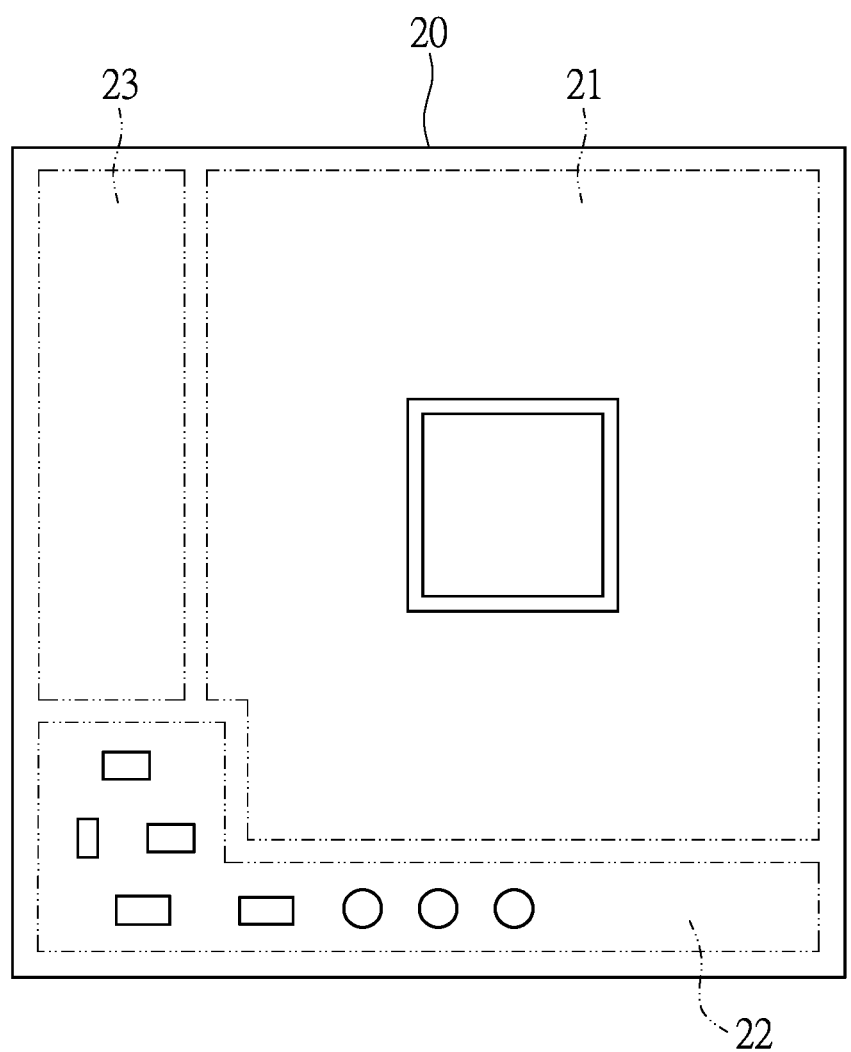
FIG. 2 is a schematic view of the conventional image sensor in a 30 micrometer semiconductor process.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment of Image Sensor

Figure 3:
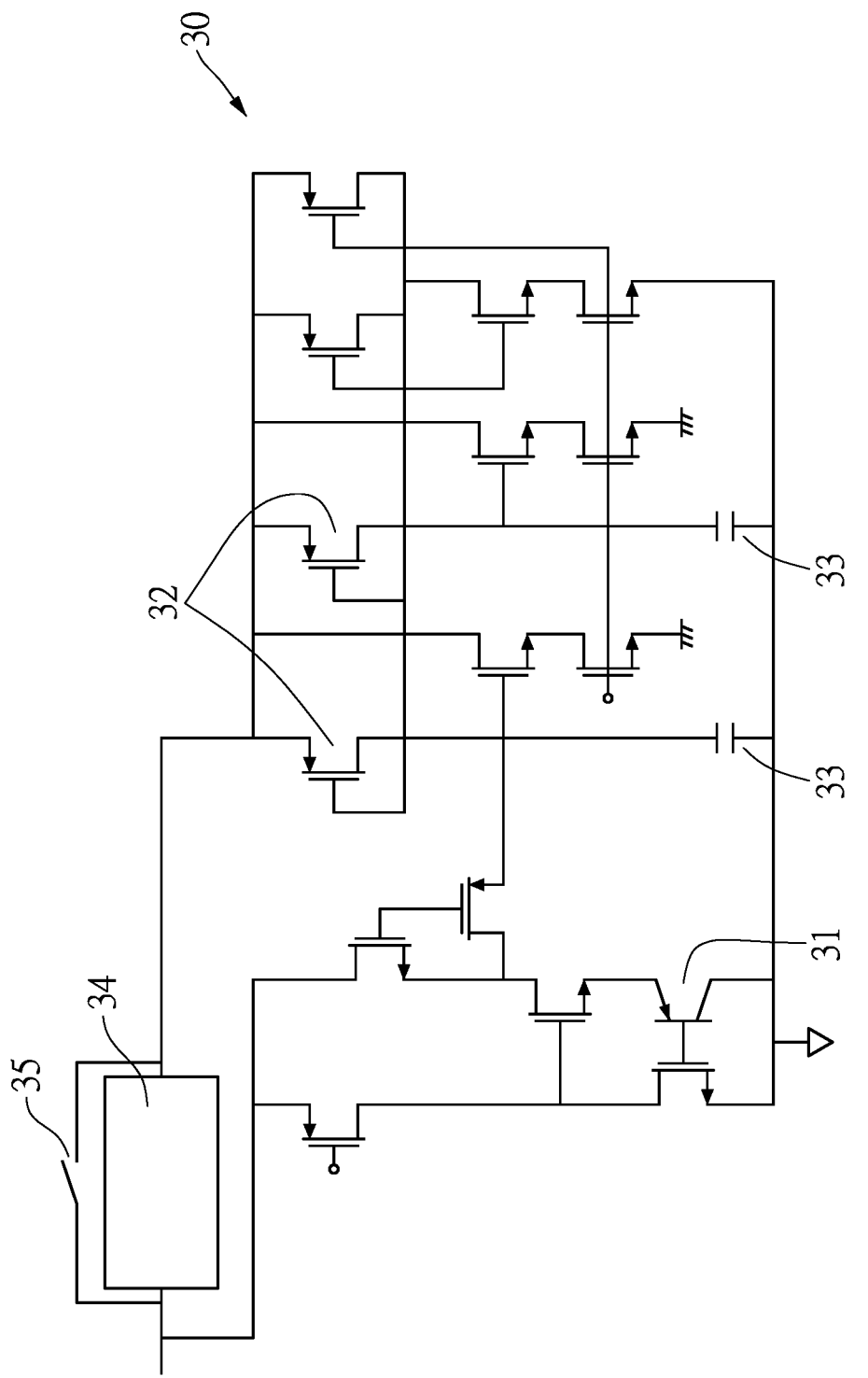
FIG. 3 is a schematic view of an image sensor in one embodiment of the present disclosure.

FIG. 3 is a schematic view of an image sensor in one embodiment of the present disclosure. The image sensor in the present disclosure is preferred to be made of Bipolar Junction Transistor (BJT), but it is not limited thereto. In a different embodiment, the image sensor is the present disclosure can be made of metal-oxide-semiconductor field-effect transistor (MOSFET).

As shown in FIG. 3, the image sensor 30 in the present disclosure includes a transistor 31, a plurality of first switches 32, at least one storage capacitor 33 and a voltage provider 34. The first switches 32 are electrically connected to the transistor 31, respectively, and the first switches 32 are controlled by the transistor 31 to be turned on or off. The first switches 32 are turned on or off so as to charge or discharge the at least one capacitor 33. The at least one capacitor 33 is electrically connected to the first switches 32 and the transistor 31. The voltage provider 34 is electrically connected to the transistor 31 and configured to provide an extra voltage for the at least one storage capacitor 33 to increase a signal-noise-ratio (SNR) of the image sensor 30.

When the semiconductor process technique for the chips of the image sensor 30 is 30 μm or above and the size of the at least one storage capacitor 33 is about 92 μm$^2$, the at least one storage capacitor 33 is considered to be small and the area of the at least one storage capacitor 33 is about 10% of the area of the image sensor 30. However, when the semiconductor process technique for the chips of the image sensor 30 is less than 30 μm and the size of the at least one storage capacitor 33 is less than 92 μm$^2$ in the present disclosure, the size of the at least one storage capacitor 33 is considered to be huge and the area of the at least one storage capacitor 33 is about 23% of the area of the image sensor 30. In order to increase or maintain the fill factor of the image sensor 30 in the present disclosure, the size of the at least one storage capacitor 33 is required to be reduced. However, when the size of the at least one storage capacitor 33 is reduced, the SNR of the image sensor 30 will drop since the total charging capacity of the at least one storage capacitor 33 is reduced.

Accordingly, in order to increase the charging capacity of the at least one storage capacitor 33 in the present disclosure (Q=CV, Q represents the charging capacity, C represents the capacitance of the at least one storage capacitor 33, and V represents the voltage value), the image sensor 30 includes a voltage provider 34, and the voltage provider 34 can be a charge bump or a boost converter, but is not limited thereto. The voltage provider 34 provides extra voltage for the at least one storage capacitor 33 so as to increase the charging capacity of the at least one storage capacitor 33.

In addition, the image sensor 30 also includes a second switch 35, and the second switch 35 is connected to the voltage provider 34 in parallel. When the image sensor 30 is operated in a normal mode, the second switch 35 is open and the voltage provider 34 does not provide extra voltage for the image sensor 30. When the image sensor 30 is operated in a boost mode, the second switch 35 is closed and the voltage provider 34 provides the extra voltage for the at least one storage capacitor 33 of the image sensor 30. In addition, the extra voltage provided by the voltage provider 34 is variable for different circumstances. Specifically, the extra voltage provided by the voltage provider 34 is variable in response to image detected by the image sensor 30 with different brightness or contrasts.

For example, as shown in FIG. 3, when high brightness/contrast of the pixel/image is provided, the voltage provided in the storage capacitor 33 is 1.8V for power saving. When low brightness/contrast of the pixel/image is provided, the voltage provided in the storage capacitor 33 is 3.0V and the SNR is increased by about 2 dB. Therefore, when the size of the storage capacitor 33 in the image sensor 30 is reduced by about 67%, the SNR is still able to be maintained. Moreover, it should be noted that the contrast or brightness discussed in the present disclosure is the comparing result that the pixel or image in a certain position is compared with the pixel or image in the surrounding area of the certain position.

Embodiment of Method for Increasing SNR of an Image Sensor

Figure 4:
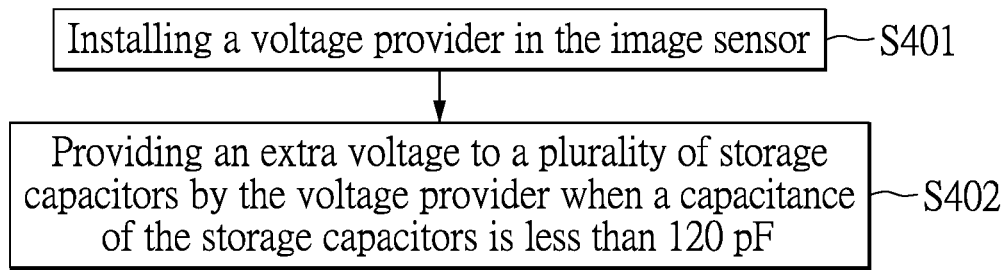
FIG. 4 is a flow chart of a method for increasing signal-noise-ratio of an image sensor in one embodiment of the present disclosure.

FIG. 4 is a flow chart of a method for increasing signal-noise-ratio of an image sensor in an embodiment of the present disclosure. The image sensor includes a transistor, at least one storage capacitor, a voltage provider, a plurality of first switches and a second switch. The structure of the image sensor used in the method for increasing SNR in the present disclosure is the same as the image sensor shown in FIG. 3 and the aforementioned description, so that details relating to the functions and connection relationships of the components in the image sensor of the current embodiment are omitted herefrom.

As shown in FIG. 4, the method for increasing a signal-noise-ratio (SNR) of the image sensor in the present disclosure includes the following steps. In step S401, a voltage provider is installed in the image sensor. The SNR of the image sensor drops when the size of the at least one storage capacitor is reduced. Therefore, when the chips manufactured by the semiconductor process of the image sensor is less than 30 μm, the SNR of the image sensor will drop. In order to increase the SNR of the image sensor when the chips manufactured by the semiconductor process of the image sensor is less than 30 μm, the charging capacity of the at least one storage capacitor is required to be increased. The equation of the charging capacity of the at least one storage is Q=CV, where Q represents the charging capacity, C represents the capacitance of the at least one storage capacitor, and V represents the voltage inputted in the at least one storage capacitor.

Accordingly, when the capacitance of the at least one storage capacitor is decreased 120 pF) but the charging capacity of the at least one storage capacitor is required to be maintained, a voltage provider is installed in the image sensor of the present disclosure.

In step S402, an extra voltage is provided to the at least one capacitor by the voltage provider when the size of the at least one storage capacitor is less than 92 μm² and the charging capacity of the at least storage capacitor is decreased. The voltage provider is capable of providing extra voltage for the at least one storage capacitor. For example, when the input voltage in the image sensor is 1.8V, the SNR of the image sensor drops because of the collective charge of the at least one storage capacitor. When the input voltage in the image sensor is increased from 1.8V to 3.0V by the voltage provider, the collective charge of the at least one storage capacitor is increased by 67% and the SNR is increased by about 2 dB. The voltage provider can be a charge pump or a boost converter, but is not limited thereto.

The second switch in the image sensor is connected to the voltage provider in parallel. When the image sensor is operated in a normal mode, the second switch is opened or cut off and the voltage provider does not provide extra voltage for the image sensor. When the image sensor is operated in a boost mode, the second switch is closed and the voltage provider provides the extra voltage for the at least one storage capacitor of the image sensor. In addition, the extra voltage provided by the voltage provider is variable for different circumstances. Specifically, the extra voltage provided by the voltage provider is variable in response to the image detected by the image sensor 30 with different brightness or contrasts.

In conclusion, when the semiconductor process of the image sensor is improved and the fill factor of the image sensor is required to be maintained or increased, the size of the at least one storage capacitor needs to be smaller. When the size of the at least one storage capacitor decreases, the voltage inputted in the image sensor needs to be increased so as to increase the charging capacity of the at least one storage capacitor. The image sensor in the present disclosure includes a voltage provider to provide extra voltage to increase the charging capacity of the storage capacitor. Therefore, the SNR of the image sensor will not be affected and the fill factor is able to be maintained at a certain level.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image sensor, comprising:
   a transistor;
   at least one storage capacitor connected to the transistor, and configured to continuously provide a voltage for brightness and contrast of images generated by the image sensor;
   a voltage provider electrically connected to the transistor and configured to provide an extra voltage for the at least one storage capacitor; and
   a plurality of first switches and a second switch, wherein the transistor is electrically connected to the first switches, the at least one storage capacitor and the voltage provider, and the voltage provider is connected to the second switch in parallel;
   wherein the extra voltage is varying between a range of input voltages in the image sensor and variable in response to the images with different brightness;
   wherein the extra voltage is provided to the at least one storage capacitor by the voltage provider when a capacitance of the at least one storage capacitor is less than 120 pF.

2. The image sensor according to claim 1, wherein the image sensor includes one of Bipolar Junction Transistor (BJT) and a Metal-Oxide-Semiconductor Field-Effect transistor (MOSFET).

3. The image sensor according to claim 1, wherein the first switches are turned on or off by the transistor so as to charge or discharge the at least one storage capacitor.

4. The image sensor according to claim 1, wherein the voltage provider provides the extra voltage for the at least one storage capacitor to increase a collective charge of the at least one storage capacitor so as to increase a signal-noise-ratio (SNR).

5. The image sensor according to claim 1, wherein chips manufactured for the image sensor are made less than 30 μm micrometer-level process.

6. The image sensor according to claim 1, wherein a size of the at least one storage capacitor is less than 92 μm².

7. The image sensor according to claim 1, wherein the image sensor is operated in a normal mode when the second switch is open, and the image sensor is operated in a voltage boost mode when the second switch is closed.

8. A method for increasing a signal noise ratio of an image sensor, the image sensor includes a transistor, a plurality of first switches, at least one storage capacitor, a voltage provider and a second switch, the transistor being electrically connected to the first switches, the at least one storage capacitor and the voltage provider, the voltage provider being connected to the second switch in parallel, and the method comprising:
   installing a voltage provider in the image sensor; and
   providing an extra voltage to a plurality of storage capacitors by the voltage provider when a capacitance of the storage capacitors is less than 120 pF;
   wherein the extra voltage is variable in response to images with different brightness.

9. The method according to claim 8, further comprising cutting off the second switch when the image sensor is operated in a normal mode or closing the second switch when the image sensor is operated in a boost mode.

10. The method according to claim 8, wherein the step of providing the extra voltage to the storage capacitors by the voltage provider is to increase the SNR of the image sensor.

11. The method according to claim 8, wherein the step of providing the extra voltage to the storage capacitors by the voltage provider is to maintain a fill factor of the image sensor.

12. The method according to claim 8, wherein the image sensor includes one of a Bipolar Junction Transistor (BJT) and a Metal-Oxide-Semiconductor Field-Effect transistor (MOSFET).

* * * * *